US009299920B2

United States Patent
Kim et al.

(10) Patent No.: US 9,299,920 B2
(45) Date of Patent: Mar. 29, 2016

(54) MAGNETIC MEMORY DEVICES WITH MAGNETIC TUNNEL JUNCTIONS

(71) Applicants: Younghyun Kim, Seoul (KR); Jae Hoon Kim, Seoul (KR); Juhyun Kim, Hwaseong-si (KR); Whankyun Kim, Seoul (KR)

(72) Inventors: Younghyun Kim, Seoul (KR); Jae Hoon Kim, Seoul (KR); Juhyun Kim, Hwaseong-si (KR); Whankyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 14/339,480

(22) Filed: Jul. 24, 2014

(65) Prior Publication Data
US 2015/0123223 A1 May 7, 2015

(30) Foreign Application Priority Data
Nov. 5, 2013 (KR) .................. 10-2013-0133751

(51) Int. Cl.
*H01L 29/82* (2006.01)
*H01L 43/08* (2006.01)
(52) U.S. Cl.
CPC ..................... *H01L 43/08* (2013.01)
(58) Field of Classification Search
CPC .......... H01L 43/08; H01L 41/12; H01L 41/47
USPC .......................................................... 257/421
See application file for complete search history.

(56) References Cited

U.S. PATENT DOCUMENTS

| | | | |
|---|---|---|---|
| 6,815,785 B2 | 11/2004 | Ooishi | |
| 7,071,009 B2 | 7/2006 | Wang et al. | |
| 7,531,367 B2 | 5/2009 | Assefa et al. | |
| 7,663,131 B2 | 2/2010 | Horng et al. | |
| 7,936,027 B2 | 5/2011 | Xiao et al. | |
| 7,955,870 B2 | 6/2011 | Ditizio | |
| 8,138,562 B2 | 3/2012 | Mao | |
| 8,491,799 B2 | 7/2013 | Jung | |
| 8,492,169 B2 | 7/2013 | Cao et al. | |
| 8,557,610 B2 | 10/2013 | Chen et al. | |
| 2004/0229430 A1 | 11/2004 | Findeis et al. | |
| 2008/0074804 A1* | 3/2008 | Nishimura | H01L 43/12 360/324.2 |
| 2009/0159562 A1 | 6/2009 | Cho et al. | |
| 2011/0235217 A1 | 9/2011 | Chen et al. | |
| 2013/0029431 A1* | 1/2013 | Takahashi | H01L 43/12 438/3 |
| 2014/0042567 A1* | 2/2014 | Jung | H01L 43/08 257/421 |

FOREIGN PATENT DOCUMENTS

KR    1020120086938 A    8/2012

* cited by examiner

*Primary Examiner* — Matthew Gordon
(74) *Attorney, Agent, or Firm* — Myers Bigel & Sibley, P.A.

(57) ABSTRACT

Provided is a magnetic memory device with a magnetic tunnel junction on a substrate. The magnetic tunnel junction may include a first magnetic structure and a second magnetic structure spaced apart from each other with a tunnel barrier interposed therebetween. When viewed in a cross-sectional view, a width of the tunnel barrier may be larger at an upper level thereof than at a lower level thereof.

19 Claims, 16 Drawing Sheets

MAGNETIC MEMORY DEVICES WITH MAGNETIC TUNNEL JUNCTIONS

CROSS-REFERENCE TO RELATED APPLICATION

This U.S. non-provisional patent application claims priority under 35 U.S.C. §119 to Korean Patent Application No. 10-2013-0133751, filed on Nov. 5, 2013 in the Korean Intellectual Property Office, the entire contents of which are hereby incorporated by reference herein.

BACKGROUND

Example embodiments of the inventive concept relate to a magnetic memory device and, in particular, to a magnetic memory device with a magnetic tunnel junction.

Due to demand for electronic devices with increased speed and/or reduced power consumption, semiconductor devices may require faster operating speeds and/or lower operating voltages. Magnetic memory devices have been suggested to satisfy such requirements. Magnetic memory devices can provide various technical advantages such as, for example, reduced latency and/or non-volatility. As a result, magnetic memory devices are emerging as next-generation memory devices.

A magnetic memory device may include a magnetic tunnel junction (MTJ). A magnetic tunnel junction may include two magnetic layers and a tunnel barrier layer interposed therebetween. Resistance of the magnetic tunnel junction may vary depending on magnetization orientations of the magnetic layers. For example, the resistance of the magnetic tunnel junction may be higher when the magnetic layers have anti-parallel magnetization orientations than when they have parallel magnetization orientations. Such a difference in resistance can be used to store data.

SUMMARY

Example embodiments of the inventive concepts provide a magnetic memory device that may be less susceptible to an electric short arising between the magnetic layers that constitute the magnetic tunnel junction MTJ. Thus, the magnetic memory devices according to example embodiments of the inventive concepts may exhibit improved reliability.

According to example embodiments of the inventive concepts, a magnetic memory device may include a substrate, and a magnetic tunnel junction on the substrate. The magnetic tunnel junction may include a first magnetic structure and a second magnetic structure that are spaced apart from each other with a tunnel barrier interposed therebetween, and when viewed in a cross-sectional view, a width of a top surface of the tunnel barrier may be larger than a width of a bottom surface of the tunnel barrier.

In example embodiments, a width of the tunnel barrier may increase monotonically from the bottom surface thereof to the top surface thereof.

In example embodiments, a width of the tunnel barrier may increase with increasing distance from the substrate.

In example embodiments, the first magnetic structure may be disposed between the substrate and the tunnel barrier and the second magnetic structure may be spaced apart from the first magnetic structure with the tunnel barrier interposed therebetween. When viewed in a cross-sectional view, a width of a top surface of the second magnetic structure may be smaller than a width of a bottom surface of the second magnetic structure.

In example embodiments, a width of the tunnel barrier may increase with increasing distance from the substrate, and a width of the second magnetic structure may decrease with increasing distance from the substrate.

In example embodiments, the top surface of the tunnel barrier may be in contact with the bottom surface of the second magnetic structure.

In example embodiments, when viewed in a cross-sectional view, a width of a top surface of the first magnetic structure may be smaller than a width of a bottom surface of the first magnetic structure.

In example embodiments, a width of the first magnetic structure may decrease with increasing distance from the substrate, and a width of the tunnel barrier may increase with increasing distance from the substrate.

In example embodiments, the second magnetic structure may include at least one magnetic layer, whose magnetization direction is switchable.

In example embodiments, the second magnetic structure may include at least one magnetic layer, whose magnetization direction is fixed.

According to example embodiments of the inventive concepts, a magnetic memory device may include a tunnel barrier on a substrate, a first magnetic structure between the substrate and the tunnel barrier, and a second magnetic structure spaced apart from the first magnetic structure with the tunnel barrier interposed therebetween. When viewed in a cross-sectional view, the tunnel barrier may have a sidewall that is slanted with increasing height above the substrate toward a first direction relative to a reference plane that is perpendicular to a top surface of the substrate, and the second magnetic structure may have a sidewall that is slanted with increasing height above the substrate toward a second direction relative to the reference plane. Here, the first and second directions may be opposite to each other. The sidewalls of the tunnel barrier and the second magnetic structure may be on a first side of the magnetic memory device.

In example embodiments, an angle between the sidewall and a bottom surface of the tunnel barrier may be larger than 90 degrees.

In example embodiments, an angle between the sidewall and a bottom surface of the second magnetic structure may be smaller than 90 degrees.

In example embodiments, a top surface of the tunnel barrier may be in contact with a bottom surface of the second magnetic structure.

In example embodiments, the first magnetic structure may have a sidewall that is slanted with increasing height above the substrate toward the second direction relative to the reference plane. The sidewall of the first magnetic structure may be on the first side of the magnetic memory device.

According to example embodiments of the inventive concepts, a magnetic memory device may include a substrate having a top surface and a bottom surface; a first magnetic structure on the top surface of the substrate; a tunnel barrier on a top surface of the first magnetic structure; and a second magnetic structure on a top surface of the tunnel barrier. A first sidewall of the second magnetic structure contacts a first sidewall of the tunnel barrier, and a section of the first sidewall of the tunnel barrier and a section of the first sidewall of the second magnetic structure that contact each other are slanted in different directions.

In example embodiments, the first sidewall of the tunnel barrier may define a first plane that bisects the first magnetic structure.

In example embodiments, the first sidewall of the second magnetic structure may define a second plane that does not bisect the first magnetic structure.

In example embodiments, a width of the top surface of the tunnel barrier may be greater than a width of the bottom surface of the tunnel barrier.

In example embodiments, a first sidewall of the first magnetic structure that contacts the first sidewall of the tunnel barrier may define a third plane that bisects both the tunnel barrier and the second magnetic structure.

BRIEF DESCRIPTION OF THE DRAWINGS

The inventive concepts will be more clearly understood from the following brief description taken in conjunction with the accompanying drawings, which depict non-limiting, example embodiments of the inventive concepts.

Figure 1:
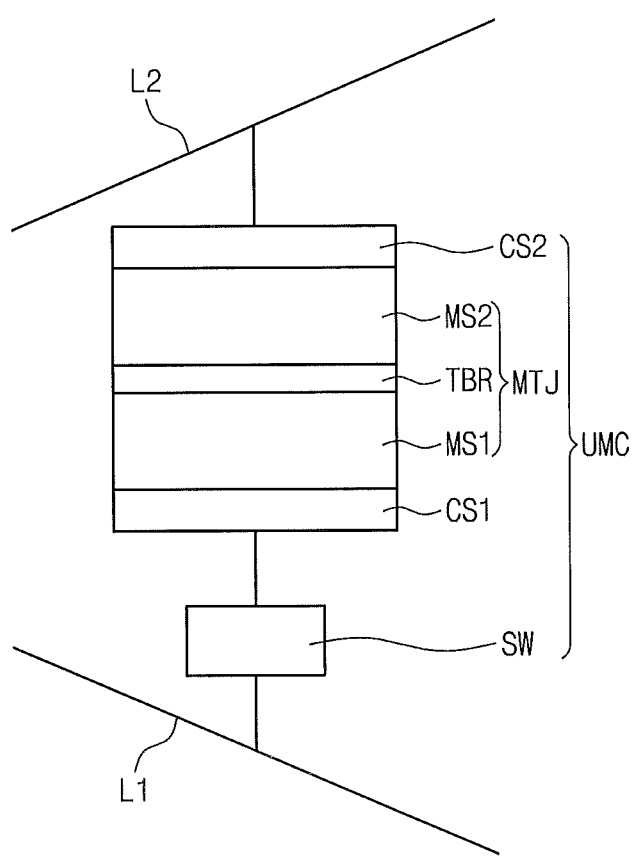
FIG. 1 is a schematic diagram illustrating a unit memory cell of a magnetic memory device according to example embodiments of the inventive concepts.

The above-described figures illustrate the general characteristics of methods, structures and/or materials utilized in certain example embodiments and supplement the written description provided below. These drawings are not, however, to scale and may not precisely reflect the precise structural or performance characteristics of any given embodiment, and should not be interpreted as defining or limiting the range of values or properties encompassed by the example embodiments.

DETAILED DESCRIPTION

Embodiments of the inventive concepts will now be described more fully with reference to the accompanying drawings, in which example embodiments are shown. The inventive concepts may, however, be embodied in many different forms and should not be construed as being limited to the example embodiments set forth herein; rather, these embodiments are provided so that this disclosure will be thorough and complete, and will fully convey the inventive concepts to those of ordinary skill in the art. In the drawings, the thicknesses of layers, regions and/or structural elements may be reduced or exaggerated for clarity. Like reference numerals in the drawings denote like elements, and thus their description in subsequent drawings may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments. As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including" specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a unit memory cell of a magnetic memory device according to example embodiments of the inventive concept.

Referring to FIG. 1, a unit memory cell UMC may be disposed between first and second interconnection lines L1 and L2. The first and second interconnection lines L1 and L2 may cross each other. Elements of the unit memory cell UMC may be connected in series between the first and second interconnection lines L1 and L2. The unit memory cell UMC may include a selection device SW and a magnetic tunnel junction MTJ. The selection device SW and the magnetic tunnel junction MTJ may be electrically connected in series between the first and second interconnection lines L1 and L2. In certain embodiments, one of the first and second interconnection lines L1 and L2 may be used as a word line, and the other may be used as a bit line.

The selection device SW may be configured to selectively control an electric current that passes through the magnetic tunnel junction MTJ. For example, the selection device SW may be one of a diode, a p-n-p bipolar junction transistor, an n-p-n bipolar junction transistor, an NMOS (n-channel metal-oxide-semiconductor) field effect transistor (FET), and a PMOS (p-channel metal-oxide-semiconductor) FET. In the case that the selection device SW is a three-terminal switching device, such as a bipolar junction transistor or a MOSFET, an additional interconnection line (not shown in FIG. 1) may be connected to a control electrode or gate of the selection device SW.

The magnetic tunnel junction MTJ may include a first magnetic structure MS1, a second magnetic structure MS2, and a tunnel barrier TBR interposed therebetween. Each of the first and second magnetic structures MS1 and MS2 may include at least one magnetic layer made of a magnetic material. In example embodiments, as shown in FIG. 1, the magnetic tunnel junction MTJ may further include a first conductive structure CS1 interposed between the first magnetic structure MS1 and the selection device SW and a second conductive structure CS2 interposed between the second magnetic structure MS2 and the second interconnection line L2.

FIGS. 2 through 5 are schematic diagrams illustrating magnetic tunnel junctions according to example embodiments of the inventive concepts.

Referring to FIGS. 2 through 5, one of the magnetic layers of the first and second magnetic structures MS1 and MS2 may be configured to have a fixed magnetization direction, which is not changed by an external magnetic field that is generated under normal operating conditions. In the present specification, the term "fixed layer PNL" will be used to represent the magnetic layer having such a fixed magnetization property (also referred to as a pinned magnetic structure). By contrast, the other of the magnetic layers of the first and second magnetic structures MS1 and MS2 may be configured to have a magnetization direction which can be switched by applying an external magnetic field thereto. Hereinafter, the term "free layer FRL" will be used to represent a magnetic layer having such a switchable magnetization property. For example, the magnetic tunnel junction MTJ may include at least one free layer FRL and at least one fixed layer PNL that are separated by the tunnel barrier TBR.

Electrical resistance of the magnetic tunnel junction MTJ may be sensitive to a relative orientation of magnetization directions of the free and fixed layers FRL and PNL. For example, the electrical resistance of the magnetic tunnel junction MTJ may be far greater when the relative orientation is antiparallel than when the relative orientation is parallel. This means that the electrical resistance of the magnetic tunnel junction MTJ can be controlled by changing the magnetization direction of the free layer FRL. Magnetic memory devices according to example embodiments of the inventive concept may use this property as a data storing mechanism.

The first and second magnetic structures MS1 and MS2 of the magnetic tunnel junction MTJ may be sequentially formed on a substrate 100. As shown in FIGS. 2 through 5, based on the relative configuration between the free layer FRL and the substrate 100 and/or a forming order of and a relative orientation of magnetization between the free and fixed layers FRL and PNL, the magnetic tunnel junction MTJ may be generally classified into four types.

Figure 2:
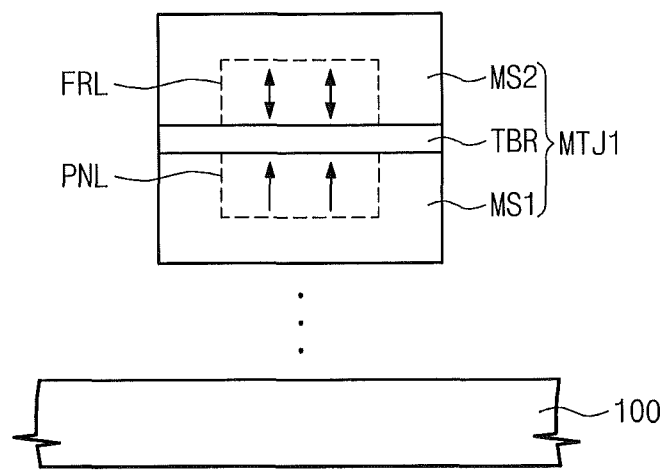
FIGS. 2 through 5 are schematic diagrams illustrating magnetic tunnel junctions according to example embodiments of the inventive concepts.
Figure 3:
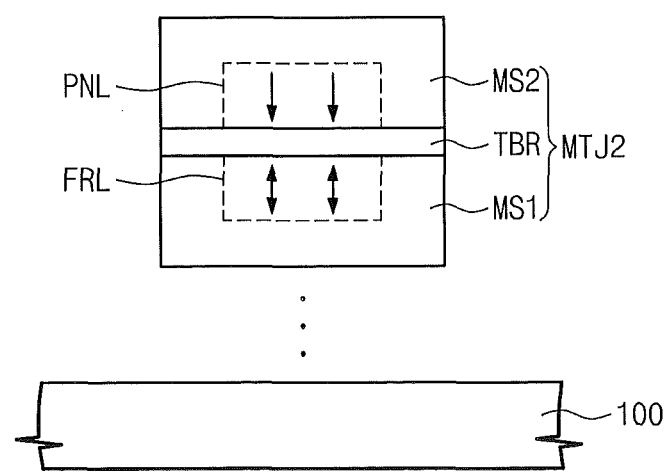

For example, each of the first and second magnetic structures MS1 and MS2 may be configured in such a way that the magnetization thereof is substantially perpendicular to a top surface of the substrate 100. As shown in FIG. 2, the magnetic tunnel junction MTJ may be a first type of magnetic tunnel junction MTJ1 configured so that the first and second magnetic structures MS1 and MS2 include the fixed and free layers PNL and FRL, respectively. Alternatively, as shown in FIG. 3, the magnetic tunnel junction MTJ may be a second type of magnetic tunnel junction MTJ2 configured so that the first and second magnetic structures MS1 and MS2 include the free and fixed layers FRL and PNL, respectively.

Figure 4:
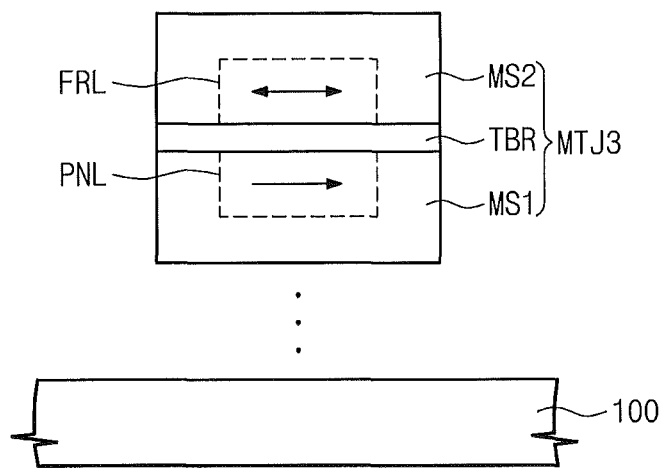
Figure 5:
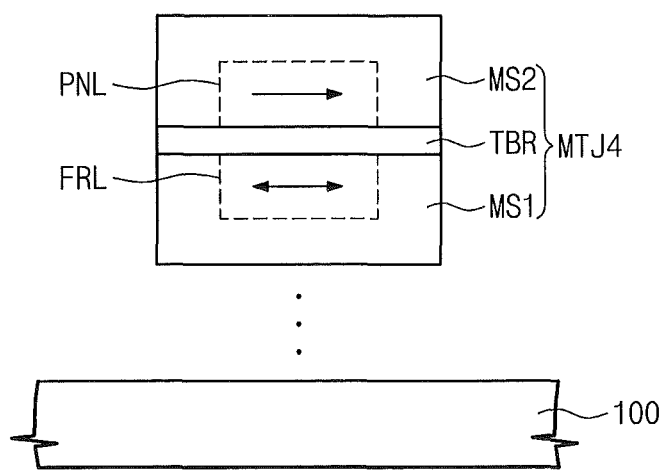

In addition, each of the first and second magnetic structures MS1 and MS2 may be configured in such a way that the magnetization thereof is substantially parallel to the top surface of the substrate 100. In this case, the magnetic tunnel junction MTJ may be a third type of magnetic tunnel junction MTJ3 configured so that the first and second magnetic structures MS1 and MS2 include the fixed and free layers PNL and FRL, respectively, as shown in FIG. 4, or a fourth type of magnetic tunnel junction MTJ4 configured so that the first and second magnetic structures MS1 and MS2 include the free and fixed layers FRL and PNL, respectively, as shown in FIG. 5.

Figure 6:
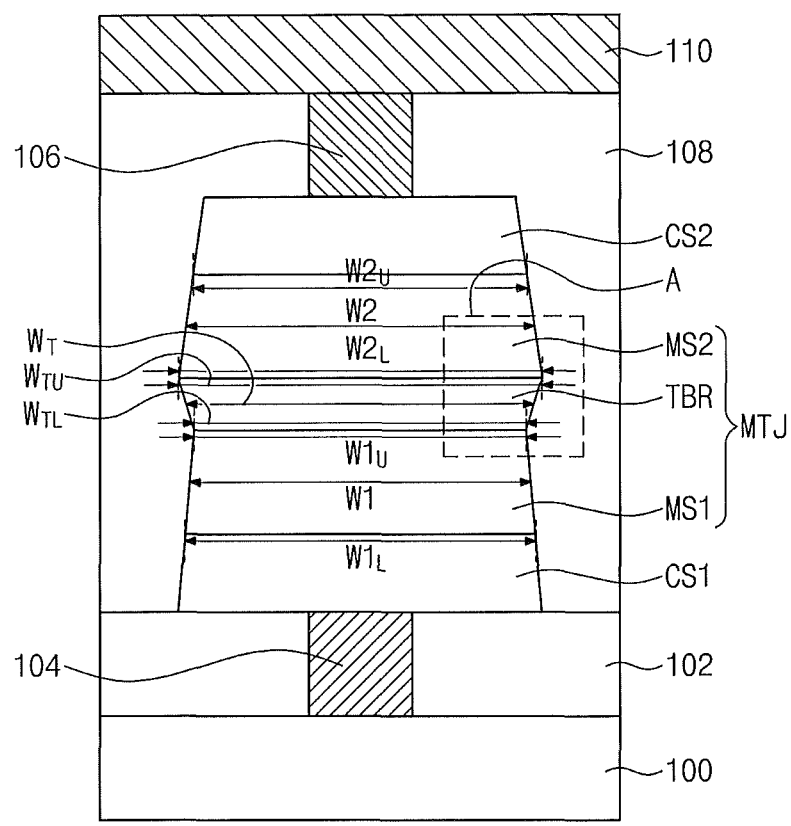
FIG. 6 is a sectional view illustrating a magnetic memory device according to example embodiments of the inventive concepts.
Figure 7:
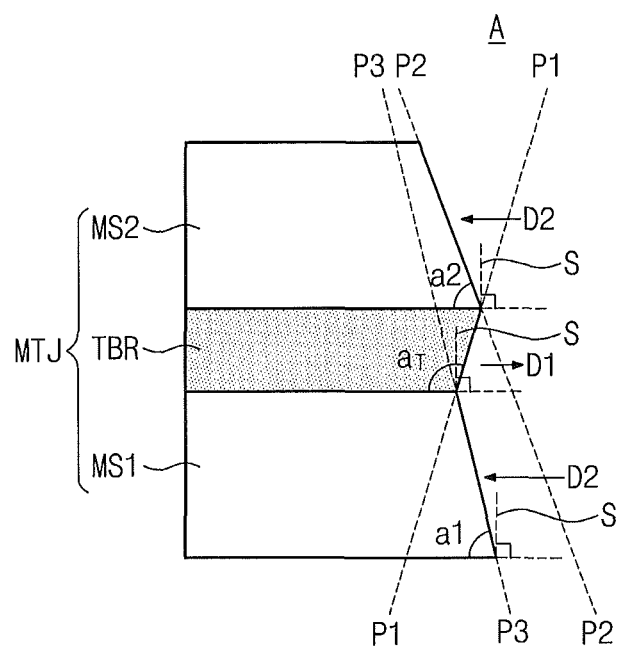
FIG. 7 is an enlarged view of a portion A of FIG. 6.
Figure 8:
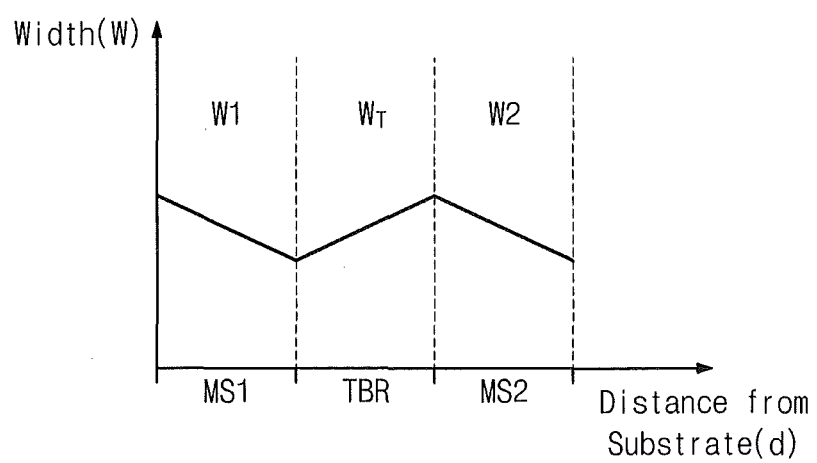
FIG. 8 is a graph illustrating variations in the widths of various elements of the magnetic tunnel junctions of the magnetic memory devices according to example embodiments of the inventive concepts.

FIG. 6 is a sectional view illustrating a magnetic memory device according to example embodiments of the inventive concept. FIG. 7 is an enlarged view of a portion A of FIG. 6. FIG. 8 is a graph illustrating variations in the widths of various elements of the magnetic tunnel junctions of magnetic memory devices according to example embodiments of the inventive concepts.

Referring to FIG. 6, a first dielectric layer 102 may be provided on a substrate 100, and a lower contact plug 104 may be provided that penetrates the first dielectric layer 102. A bottom surface of the lower contact plug 104 may be electrically connected to one terminal of a selection device, which may be implemented in the substrate 100 in some embodiments. The substrate 100 may be formed of or include one of semiconductor materials, insulating materials, or semiconductor or conductive materials covered with an insulating layer. For example, the substrate 100 may be a silicon wafer. The first dielectric layer 102 may include oxide, nitride, and/or oxynitride. The lower contact plug 104 may include at least one of conductive materials, such as doped semiconductor (e.g., doped silicon, doped germanium, or doped silicon-germanium), metals (e.g., titanium, tantalum, or tungsten), and conductive metal nitrides (e.g., titanium nitride, tantalum nitride).

The first conductive structure CS1, the magnetic tunnel junction MTJ, and the second conductive structure CS2 may be sequentially stacked on the first dielectric layer 102. The first conductive structure CS1 may be electrically coupled to a top surface of the lower contact plug 104. Although not shown, the first conductive structure CS1 may include a first electrode and a seed layer that are sequentially stacked on the first dielectric layer 102 and on the contact plug 104. The magnetic tunnel junction MTJ may include the first magnetic structure MS1 on the first conductive structure CS1, the second magnetic structure MS2 on the first magnetic structure MS1, and the tunnel barrier TBR between the first magnetic structure MS1 and the second magnetic structure MS2. In example embodiments, the first magnetic structure MS1 may be provided between the first conductive structure CS1 and the tunnel barrier TBR, and the second magnetic structure MS2 may be provided between the tunnel barrier TBR and the second conductive structure CS2. Although not shown, the second conductive structure CS2 may include a second electrode on the second magnetic structure MS2 and a capping layer between the second magnetic structure MS2 and the second electrode.

When viewed in a cross-sectional view, as shown in FIGS. 6 and 8, at least a portion of the tunnel barrier TBR may have a width $W_T$ that increases with increasing distance from the substrate 100. For example, a width of a top surface of the tunnel barrier TBR that is spaced apart from the substrate 100 may exceed a width of a bottom surface of the tunnel barrier TBR that is closer to the substrate 100. In some embodiments, the width $W_T$ of the tunnel barrier TBR may monotonically increase from the bottom surface to the top surface thereof.

In example embodiments, a width $W_{TL}$ of the bottom surface of the tunnel barrier TBR may be smaller than a width $W_{TU}$ of the top surface of the tunnel barrier TBR, and the width $W_T$ of the tunnel barrier TBR may monotonically increase as a function of distance away from a bottom surface thereof. Accordingly, as shown in FIG. 7, the tunnel barrier TBR may have a sidewall that is slanted with increasing height above the substrate 100 toward a first direction D1 relative to a reference plane S that is normal to the top surface of the substrate 100. Hereinafter, the term "negative sidewall profile" will be used to refer to a sidewall profile of a pattern that is slanted with increasing height above the substrate 100 toward the first direction D1. An angle $a_T$ between the bottom surface and a sidewall of the tunnel barrier TBR may be larger than 90 degrees (i.e., may be an obtuse angle).

When viewed in a cross-sectional view, as shown in FIGS. 6 and 8, a portion of the first magnetic structure MS1 may have a width W1 that decreases with increasing distance from the substrate 100. For example, a width of the upper surface of the first magnetic structure MS1 that is spaced apart from the substrate 100 is smaller than a width of the lower surface of the first magnetic structure MS1 that is closer to the substrate 100. In certain embodiments, the width W1 of the first magnetic structure MS1 may monotonically decrease from the bottom surface to the top surface thereof.

In example embodiments, a width $W1_L$ of the bottom surface of the first magnetic structure MS1 may be larger than a width $W1_U$ of the top surface of the first magnetic structure MS1, and the width W1 of the first magnetic structure MS1 may monotonically decrease as a function of distance away from a bottom surface thereof. Accordingly, as shown in FIG. 7, the first magnetic structure MS1 may have a sidewall that is slanted with increasing height above the substrate 100 toward a second direction D2, which is opposite the first direction D1, relative to the reference plane S. Hereinafter, the term "positive sidewall profile" will be used to refer to a sidewall profile of a pattern that is slanted with increasing height above the substrate 100 toward the second direction D2. An angle a1 between the bottom surface and a sidewall of the first magnetic structure MS1 may be less than 90 degrees (i.e., may be an acute angle). However, in other embodiments, unlike that shown in FIG. 7, the sidewall of the first magnetic structure MS1 may be perpendicular to the top surface of the substrate 100.

The top surface of the first magnetic structure MS1 may be in contact with the bottom surface of the tunnel barrier TBR. In certain embodiments, a width $W1_U$ of a top surface of the first magnetic structure MS1 may be substantially the same as a width $W_{TL}$ of the bottom surface of the tunnel barrier TBR.

As shown in FIGS. 6 and 8, when viewed in a cross-sectional view, a portion of the second magnetic structure MS2 may have a width W2 that decreases with increasing distance from the substrate 100. For example, a width of an upper surface of the second magnetic structure MS2 that is spaced apart from the substrate 100 is smaller than a width of a lower surface of the second magnetic structure MS2 that is closer to the substrate 100. In certain embodiments, the width W2 of the second magnetic structure MS2 may monotonically decrease from the bottom surface to the top surface thereof.

In example embodiments, a width $W2_L$ of a bottom surface of the second magnetic structure MS2 may be larger than a width $W2_U$ of the top surface of the second magnetic structure MS2, and the width W2 of the second magnetic structure MS2 may monotonically decrease as a function of distance away from a bottom surface thereof. Accordingly, as shown in FIG. 7, the second magnetic structure MS2 may have a sidewall that is slanted with increasing height above the substrate 100 toward the second direction D2 relative to the reference plane S. In other words, the second magnetic structure MS2 may have the positive sidewall profile. An angle a2 between the bottom surface and a sidewall of the second magnetic structure MS2 may be smaller than 90 degrees (i.e., an acute angle). However, in other embodiments, unlike that shown in FIG. 7, the sidewall of the second magnetic structure MS2 may be perpendicular to the top surface of the substrate 100.

The bottom surface of the second magnetic structure MS2 may be in contact with the top surface of the tunnel barrier TBR. In certain embodiments, the width $W2_L$ of the bottom surface of the second magnetic structure MS2 may be substantially the same as the width $W_{TU}$ of the top surface of the tunnel barrier TBR.

The first conductive structure CS1 may have a sidewall that is aligned with a sidewall of the first magnetic structure MS1, and the second conductive structure CS2 may have a sidewall that is aligned with a sidewall of the second magnetic structure MS2.

The first conductive structure CS1 may include a first electrode, which is provided on the first dielectric layer 102 and is electrically connected to the top surface of the lower contact plug 104, and a seed layer that is disposed between the first electrode and the magnetic tunnel junction MTJ. The first electrode may be formed of or include, for example, one or more conductive metal nitrides (such as titanium nitride and/or tantalum nitride), and the seed layer may include a material allowing a layer thereon to have crystalline structure. In example embodiments, the seed layer may include ruthenium (Ru) and/or titanium (Ti). In other embodiments, the seed layer may include at least one of platinum (Pt), palladium (Pd), gold (Au), silver (Ag), copper (Cu), or aluminum (Al).

FIGS. 9 through 12 are sectional views illustrating first magnetic structures of magnetic tunnel junctions according to example embodiments of the inventive concepts.

Figure 9:
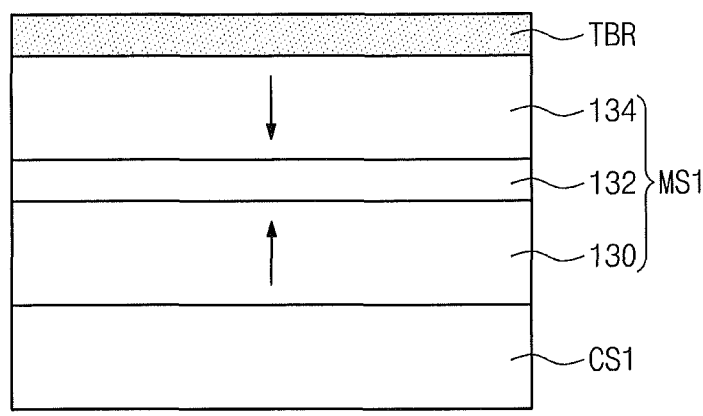
FIGS. 9 through 12 are sectional views illustrating first magnetic structures of magnetic tunnel junctions according to example embodiments of the inventive concepts.

Referring to FIG. 9, the first magnetic structure MS1 may include a first fixed layer 130 between the first conductive structure CS1 and the tunnel barrier TBR, a second fixed layer 134 between the first fixed layer 130 and the tunnel barrier TBR, and a first exchange coupling layer 132 between the first fixed layer 130 and the second fixed layer 134. The first magnetic structure MS1 according to the present embodiment may be a multi-layered magnetic structure that is configured to include the fixed layer PNL of the first type of the magnetic tunnel junction MTJ1 described with reference to FIG. 2.

The first fixed layer 130 may be formed of a magnetic material exhibiting an intrinsic perpendicular magnetization property (hereinafter, referred to as a "perpendicular magnetization material"). Herein, an intrinsic perpendicular magnetization property refers to a magnetization direction of a magnetic layer that is oriented parallel to its thickness direction or perpendicular to its main surface, when there is no external magnetic field is applied thereto. For example, if a magnetic layer with the perpendicular magnetization property is formed on a substrate, a magnetization direction of the magnetic layer may be substantially perpendicular to a top surface of the substrate.

For the first fixed layer 130, the intrinsic perpendicular magnetization property may be realized by a single-layered or multi-layered structure that includes at least one perpendicular magnetization material that contains cobalt. In example embodiments, the first fixed layer 130 may be a single-layered or multi-layered structure including at least one of cobalt-platinum alloys or cobalt-platinum alloys that further include an element X, where the element X may be at least one of boron, ruthenium, chromium, tantalum, and/or oxide. In other embodiments, the first fixed layer 130 may be a multi-layered structure in which cobalt-containing layers and precious metal layers are alternatingly and repeatedly stacked. In an example embodiment, each cobalt-containing layer may be a layer of cobalt, cobalt iron, cobalt nickel, and/or cobalt chromium, and each precious metal layer may be a platinum layer and/or a palladium layer. In still other embodiments, the first fixed layer 130 may be a multi-layered structure including at least one of the materials (e.g., the cobalt-platinum alloys or the cobalt-platinum alloys added with the element X) enumerated in the example embodiments and at least one of the materials (e.g., cobalt, cobalt iron, cobalt nickel, cobalt chromium, platinum, and/or palladium) enumerated in the other embodiments.

Intrinsic perpendicular magnetization materials for the first fixed layer 130 are described by example to provide better understanding of inventive concepts, but example embodiments of inventive concepts are not limited thereto. For example, the first fixed layer 130 may include at least one of: (a) CoFeTb, in which the relative content of Tb is 10% or more; (b) CoFeGd, in which the relative content of Gd is 10% or more; (c) CoFeDy; (d) FePt with the $L1_0$ structure; (e) FePd with the $L1_0$ structure; (f) CoPd with the $L1_0$ structure; (g) CoPt with the $L1_0$ or $L1_1$ structure; (h) CoPt with the hexagonal close packing (HCP) structure; (i) alloys containing at least one of materials in items of (a) to (h) above; and/or (j) a multi-layered structure including magnetic and non-magnetic layers alternatingly stacked. The multi-layered structure including the alternatingly-stacked magnetic and non-magnetic layers may include at least one of (Co/Pt)n, (CoFe/Pt)n, (CoFe/Pd)n, (CoP)n, (Co/Ni)n, (CoNi/Pt)n, (CoCr/Pt)n, and/or (CoCr/Pd)n, where the subscript n denotes the stacking number. In certain embodiments, the first fixed layer 130 may further include a cobalt layer or a cobalt-rich layer that is in direct contact with the first exchange-coupling layer 132.

The first exchange-coupling layer 132 may be at least one of ruthenium, iridium, and/or rhodium. According to example embodiments of the inventive concepts, the second fixed layer 134 may be antiferromagnetically exchange-coupled to the first fixed layer 130 through the first exchange-coupling layer 132, thereby having a magnetization direction parallel to a thickness direction thereof. A thickness of the first exchange-coupling layer 132 may be controlled so that the second fixed layer 134 can have a perpendicular magnetization that is opposite the magnetization direction of the first fixed layer 130. For example, the thickness of the first exchange-coupling layer 132 may range from about 2 Å (Angstroms) to about 10 Å (Angstroms).

The second fixed layer 134 may be formed of a magnetic material exhibiting an intrinsic in-plane magnetization property (hereinafter, referred as to an "intrinsic in-plane magnetization material"). An intrinsic in-plane magnetization property refers to a magnetization direction of a magnetic layer that is oriented parallel to a longitudinal direction thereof when there is no external magnetic field applied thereto. For example, if a magnetic layer with an intrinsic in-plane magnetization property is formed on a substrate, a magnetization direction of the magnetic layer may be oriented substantially parallel to the top surface of the substrate. In other words, the second fixed layer 134 may have a magnetization direction oriented parallel to a surface thereof having the largest area, when there is no external magnetic field applied thereto.

In example embodiments, the intrinsic in-plane magnetization property of the second fixed layer 134 may be realized by a single-layered or multi-layered structure that includes at least one of cobalt, iron, or alloys thereof. For example, the second fixed layer 134 may be a single-layered or multi-layered structure including at least one of CoFeB, CoHf, Co, and/or CoZr. As an example, the second fixed layer 134 may be a dual-layered structure including a Co layer and a CoHf layer or a dual-layered structure that includes a CoFeB layer. Intrinsic in-plane magnetization materials are described as examples for the second fixed layer 134 to provide better understanding of inventive concepts, but example embodiments of inventive concepts may not be limited thereto.

An external factor may change the magnetization direction of the second fixed layer 134 from the in-plane state to the perpendicular state. For example, the second fixed layer 134 may be in contact with the tunnel barrier TBR, and as the result of such a contact, the second fixed layer 134 may exhibit the perpendicular magnetization direction. In that the tunnel barrier TBR serves as an external factor changing the magnetization direction of the second fixed layer 134, the second fixed layer 134 may have an extrinsic perpendicular magnetization property, and hence the second fixed layer 134 may be an extrinsic perpendicular magnetization structure.

In the case where the second fixed layer 134 is in contact with the tunnel barrier TBR, the second fixed layer 134 may exhibit the extrinsic perpendicular magnetization property or serve as the extrinsic perpendicular magnetization structure, due to interface anisotropy at an interface therebetween. There are various causes for the interface anisotropy. For example, in the case where the tunnel barrier TBR includes MgO and the second fixed layer 134 includes CoFeB, the interface anisotropy may result from bonding between oxygen atoms in the tunnel barrier TBR and iron atoms in the second fixed layer 134. The bonding between oxygen and iron atoms may be enhanced when a nonmetallic element (e.g., boron) is exhausted from the second fixed layer 134 through the interface between the tunnel barrier TBR and the second fixed layer 134.

The interface anisotropy of the second fixed layer 134 may be induced by an additional thermal treatment process, which may be performed after the formation of the second fixed layer 134. For example, the second fixed layer 134 may include at least a portion having an amorphous structure as deposited/grown, and then a thermal treatment process may be performed that transforms the second fixed layer 134 to have the extrinsic perpendicular magnetization property. During the thermal treatment, a crystal structure of the second fixed layer 134 may be changed depending on the crystal structure of the tunnel barrier TBR. For example, in the case where the tunnel barrier TBR has a NaCl crystal structure, the crystal structure of the second fixed layer 134 may be changed to have a body-centered cubic structure resembling the NaCl crystal structure. In other words, <001> crystal planes of the tunnel barrier TBR and the second fixed layer 134 may be in contact with each other, thereby forming an interface. The lattice matching at the interface between the tunnel barrier TBR and the second fixed layer 134 may contribute to enhance a magnetoresistance ratio of the magnetic tunnel junction.

Figure 10:
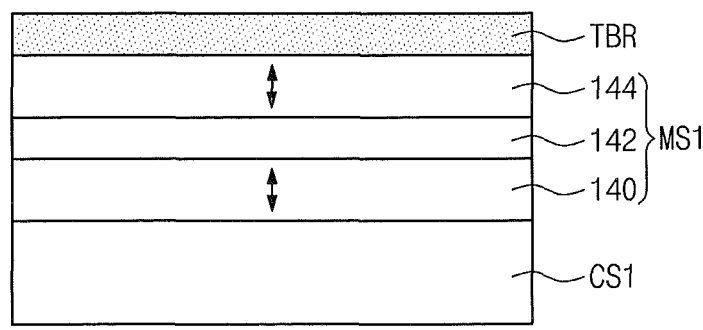

Referring to FIG. 10, in other embodiments, the first magnetic structure MS1 may include a first free layer 140, a second exchange coupling layer 142, and a second free layer 144 that are sequentially provided between the first conductive structure CS1 and the tunnel barrier TBR. The first magnetic structure MS1 according to the present embodiment may be a multi-layered magnetic structure that is configured to include the free layer FRL of the second type of the magnetic tunnel junction MTJ2 described with reference to FIG. 3.

The second free layer 144 may be formed of a magnetic material having the intrinsic in-plane magnetization property. In example embodiments, the intrinsic in-plane magnetization property of the second free layer 144 may be a single-layered or multi-layered structure that includes at least one of cobalt, iron, or alloys thereof. For example, the second free layer 144 may be a single-layered or multi-layered structure including at least one of CoFeB, CoHf, Co, and/or CoZr. Alternatively, the second free layer 144 may be a dual-layered structure including a Co layer and a CoHf layer or a dual-layered structure including a CoFeB layer.

An external factor may change the magnetization direction of the second free layer 144 from the in-plane state to the perpendicular state. For example, the second free layer 144 may be formed to be in contact with the tunnel barrier TBR, and in this case, the second free layer 144 may exhibit the extrinsic perpendicular magnetization property or serve as the extrinsic perpendicular magnetization structure, due to interface anisotropy at an interface therebetween.

The second exchange-coupling layer 142 may be a nonmagnetic metal layer. For example, the second exchange-coupling layer 142 may be formed of at least one of tantalum, ruthenium, iridium, and/or rhodium. The second free layer 144 may be antiferromagnetically exchange-coupled to the first free layer 140 through the second exchange coupling layer 142.

The second free layer 144 may contain the same material as the first free layer 140. For example, the first magnetic structure MS1 may include a pair of free layers 140 and 144, which may be formed of a cobalt-iron-boron (CoFeB) alloy, and the second exchange-coupling layer 142 may be interposed therebetween and formed of tantalum.

In other embodiments, the first free layer 140 may be formed of a magnetic material having the intrinsic perpendicular magnetization property. The intrinsic perpendicular magnetization property may be realized by a single-layered or multi-layered structure including at least one cobalt-containing perpendicular magnetization material. For example, the first free layer 140 may be a single-layered or multi-layered structure including a cobalt-platinum alloy or cobalt-platinum alloys that further include an element X, where the element X is at least one of boron, ruthenium, chromium, tantalum, or oxide. Alternatively, the first free layer 140 may be a multi-layered structure including cobalt-containing layers and noble metal layers alternatingly stacked on each other. In example embodiments, the cobalt-containing layers may be one of cobalt, cobalt iron, cobalt nickel, and cobalt chromium, and the noble metal layers may be one of platinum and palladium. In certain embodiments, the first free layer 140 may be a multi-layered structure including at least one of the materials (e.g., the cobalt-platinum alloy or cobalt-platinum alloys added with an element X) and at least one of the materials (e.g., cobalt, cobalt iron, cobalt nickel, cobalt chromium, platinum, and/or palladium) enumerated above.

Figure 11:
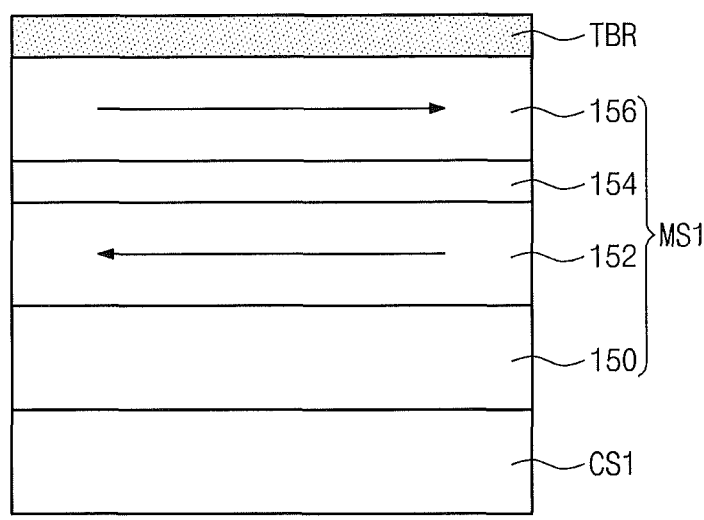

Referring to FIG. 11, in further embodiments, the first magnetic structure MS1 may include a pinning layer 150 between the first conductive structure CS1 and the tunnel barrier TBR and a first pinned layer 152, a third exchange coupling layer 154, and a second pinned layer 156 that are sequentially provided between the pinning layer 150 and the tunnel barrier TBR. The first pinned layer 152 may be interposed between the pinning layer 150 and the third exchange coupling layer 154, and the second pinned layer 156 may be interposed between the third exchange coupling layer 154 and the tunnel barrier TBR. The first magnetic structure MS1 according to the present embodiment may be a multi-layered magnetic structure that is configured to include the free layer FRL of the third type of the magnetic tunnel junction MTJ3 described above with reference to FIG. 4. The first pinned layer 152 may have a magnetization direction fixed by the pinning layer 150. The third exchange coupling layer 154 may be configured in such a way that the first pinned layer 152 and the second pinned layer 156 can have magnetization directions that are anti-parallel to each other.

The pinning layer 150 may include at least one antiferromagnetic material. For example, the pinning layer 150 may include at least one of platinum manganese (PtMn), iridium manganese (IrMn), manganese oxide (MnO), manganese sulfide (MnS), manganese telluride (MnTe), or manganese fluoride (MnF). The second pinned layer 156 may include at least one ferromagnetic material. For example, the second pinned layer 156 may include at least one of CoFeB (cobalt-iron-boron), CoFe (cobalt-iron), NiFe (nickel-iron), CoFePt (cobalt-iron-platinum), CoFePd (cobalt-iron-palladium), CoFeCr (cobalt-iron-chromium), CoFeTb (cobalt-iron-terbium), or CoFeNi (cobalt-iron-nickel). The first pinned layer 152 may include at least one ferromagnetic material. For example, the first pinned layer 152 may include at least one of CoFeB (cobalt-iron-boron), CoFe (cobalt-iron), NiFe (nickel-iron), CoFePt (cobalt-iron-platinum), CoFePd (cobalt-iron-palladium), CoFeCr (cobalt-iron-chromium), CoFeTb (cobalt-iron-terbium), or CoFeNi (cobalt-iron-nickel). The third exchange coupling layer 154 may include at least one of ruthenium (Ru), iridium (Ir), or rhodium (Rh).

Figure 12:
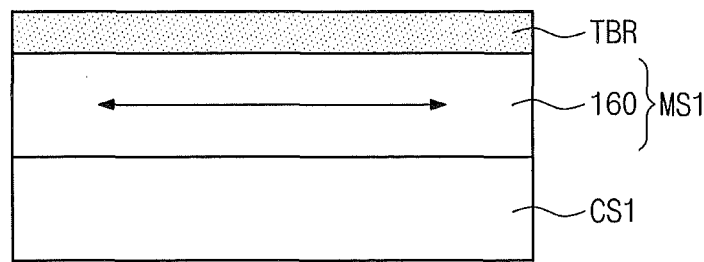

Referring to FIG. 12, in still further embodiments, the first magnetic structure MS1 may include a third free layer 160 between the first conductive structure CS1 and the tunnel barrier TBR. The first magnetic structure MS1 according to the present embodiment may be a multi-layered magnetic structure that is configured to include the free layer FRL of the fourth type of magnetic tunnel junction MTJ4 described above with reference to FIG. 5.

The third free layer 160 may be formed of or include at least one ferromagnetic material, such as cobalt (Co), iron (For instance,) or nickel (Ni). As an example, the third free layer 160 may be formed of CoFeB, CoFe and/or CoFeNi.

Referring back to FIG. 6, the tunnel barrier TBR may include at least one of magnesium oxide, titanium oxide, aluminum oxide, magnesium-zinc oxide, or magnesium-boron oxide, titanium nitride, or vanadium nitride. For example, the tunnel barrier TBR may be a magnesium oxide (MgO) layer. In certain embodiments, the tunnel barrier TBR may be configured to include a plurality of layers.

Figure 13:
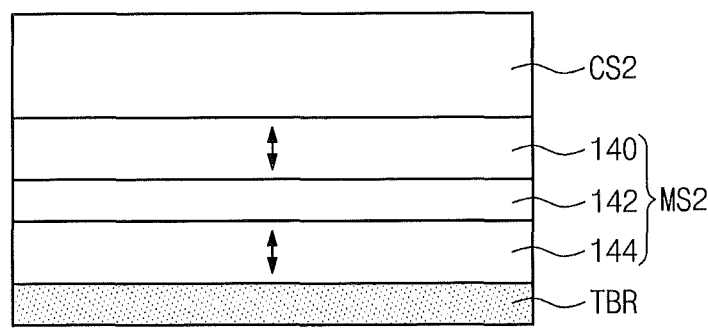
FIGS. 13 and 16 are sectional views illustrating second magnetic structures of magnetic tunnel junctions according to example embodiments of the inventive concepts.
Figure 16:
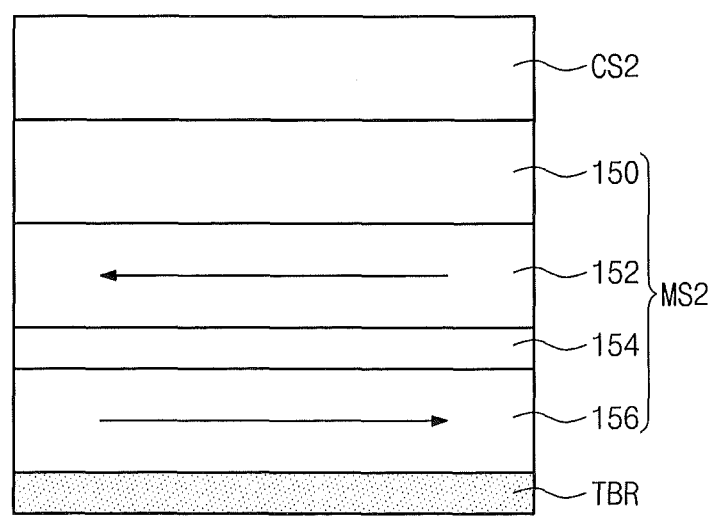

FIGS. 13 and 16 are sectional views illustrating second magnetic structures of magnetic tunnel junctions according to example embodiments of the inventive concepts.

Referring to FIG. 13, the second magnetic structure MS2 may include a first free layer 140, a second exchange coupling layer 142, and a second free layer 144 that are sequentially provided between the tunnel barrier TBR and the second conductive structure CS2. The second magnetic structure MS2 according to the present embodiment may be a multi-layered magnetic structure that is configured to include the free layer FRL of the first type of magnetic tunnel junction MTJ1 described with reference to FIG. 2.

In detail, the first free layer 140 may be disposed between the second conductive structure CS2 and the second exchange coupling layer 142, and the second free layer 144 may be disposed between the tunnel barrier TBR and the second exchange coupling layer 142. The first free layer 140 may be antiferromagnetically exchange-coupled to the second free layer 144 through the second exchange coupling layer 142. Except for the change in positions of the first and second free layers 140 and 144, the first and second free layers 140 and 144 may be configured to have substantially the same features as those of FIG. 10, and thus, a detailed description thereof will be omitted here.

Figure 14:
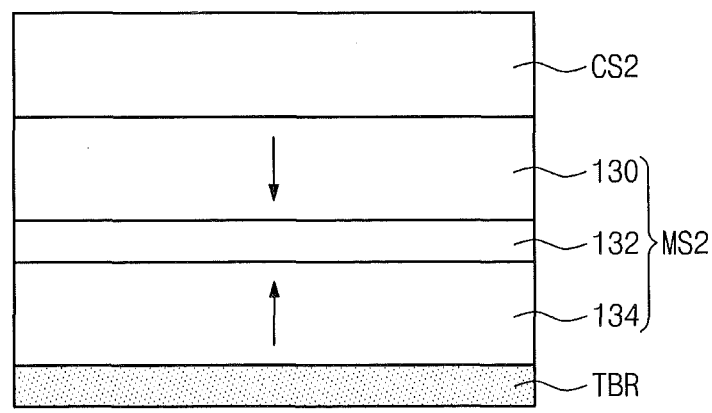

Referring to FIG. 14, in yet additional embodiments, the second magnetic structure MS2 may include a first fixed layer 130, a first exchange coupling layer 132, and a second fixed layer 134 that are sequentially provided between the tunnel barrier TBR and the second conductive structure CS2. The second magnetic structure MS2 according to the present embodiment may be a multi-layered magnetic structure that is configured to include the fixed layer PNL of the second type of magnetic tunnel junction MTJ2 described above with reference to FIG. 3.

In example embodiments, the first fixed layer 130 may be between the second conductive structure CS2 and the first exchange coupling layer 132, and the second fixed layer 134 may be between the tunnel barrier TBR and the first exchange coupling layer 132. The first fixed layer 130 may be antiferromagnetically exchange-coupled to the second fixed layer 134 through the first exchange coupling layer 132. Except for the change in positions of the first and second fixed layers 130 and 134, the first and second fixed layers 130 and 134 may be configured to have substantially the same features as those of FIG. 9, and thus, a detailed description thereof will be omitted here.

Figure 15:
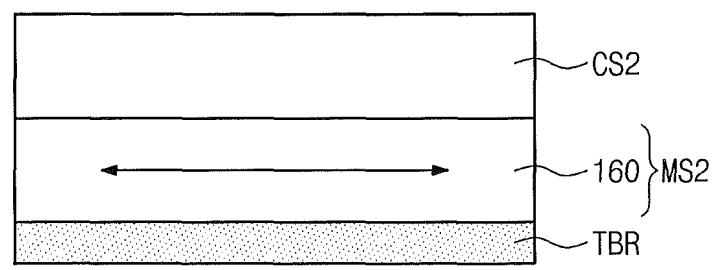

Referring to FIG. 15, in further embodiments, the second magnetic structure MS2 may include a third free layer 160 between the tunnel barrier TBR and the second conductive structure CS2. The second magnetic structure MS2 according to the present embodiment may be a multi-layered magnetic structure that is configured to include the free layer FRL of the third type of magnetic tunnel junction MTJ3 described above with reference to FIG. 4. Except for the change in position of the third free layer 160, the third free layer 160 may be configured to have substantially the same features as those of FIG. 12, and thus, a detailed description thereof will be omitted here.

Referring to FIG. 16, in still further embodiments, the second magnetic structure MS2 may include a pinning layer 150, which is interposed between the tunnel barrier TBR and the second conductive structure CS2, and a first pinned layer 152, a third exchange coupling layer 154, and a second pinned layer 156, which are sequentially provided between the pinning layer 150 and the tunnel barrier TBR. The first pinned layer 152 may be interposed between the pinning layer 150 and the third exchange coupling layer 154, and the second pinned layer 156 may be interposed between the third exchange coupling layer 154 and the tunnel barrier TBR. The second magnetic structure MS2 according to the present embodiment may be a multi-layered magnetic structure that includes the fixed layer PNL of the fourth type of magnetic tunnel junction MTJ4 described above with reference to FIG. 5. Except for the change in positions of the pinning layer 150, the first pinned layer 152, and the second pinned layer 156, they may be configured to have substantially the same features as those of FIG. 11, and thus, a detailed description thereof will be omitted here.

Referring back to FIG. 6, the second conductive structure CS2 may include at least one of tantalum (Ta), aluminum (Al), copper (Cu), gold (Au), silver (Ag), titanium (Ti), or conductive metal nitrides (such as titanium nitride and/or tantalum nitride).

A second dielectric layer 108 may be provided on the substrate 100 that covers the first conductive structure CS1, the magnetic tunnel junction MTJ, and the second conductive structure CS2. An upper contact plug 106 may be formed through the second dielectric layer 108 and be connected to the second conductive structure CS2. The second dielectric layer 108 may include oxide, nitride and/or oxynitride, and the upper contact plug 106 may include at least one of metals (e.g., titanium, tantalum, copper, aluminum, and/or tungsten) and conductive metal nitrides (e.g., titanium nitride and/or tantalum nitride). An interconnection line 110 may be provided on the second dielectric layer 108. The interconnection line 110 may be connected to the upper contact plug 106. The interconnection line 110 may include at least one of metals (e.g., titanium, tantalum, copper, aluminum, and/or tungsten) and conductive metal nitrides (e.g., titanium nitride and/or tantalum nitride). In example embodiments, the interconnection line 110 may serve as a bit line of the semiconductor device.

Figure 19:
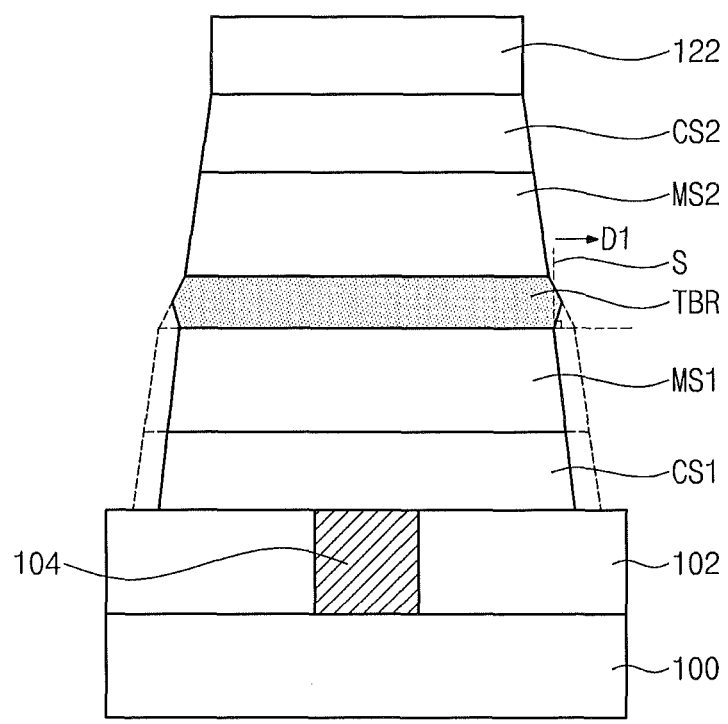
Figure 20:
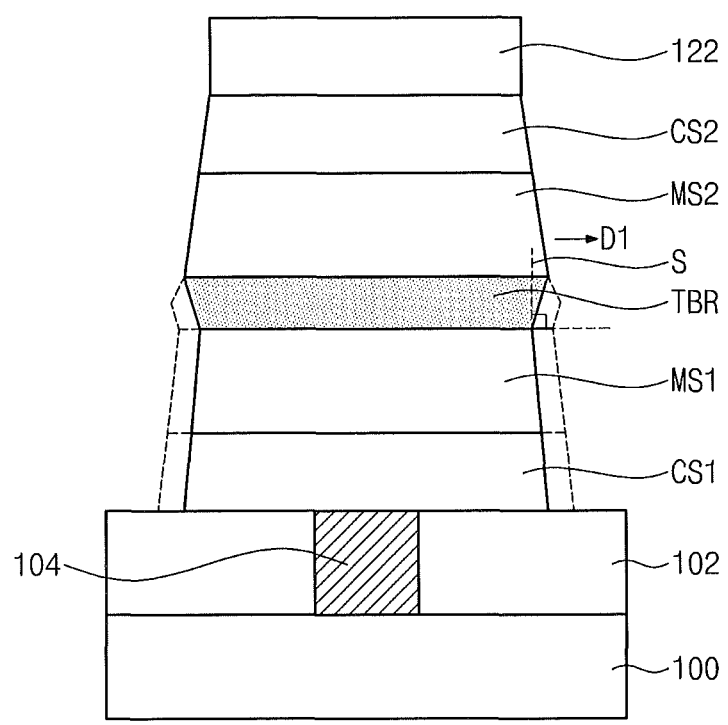
Figure 21:
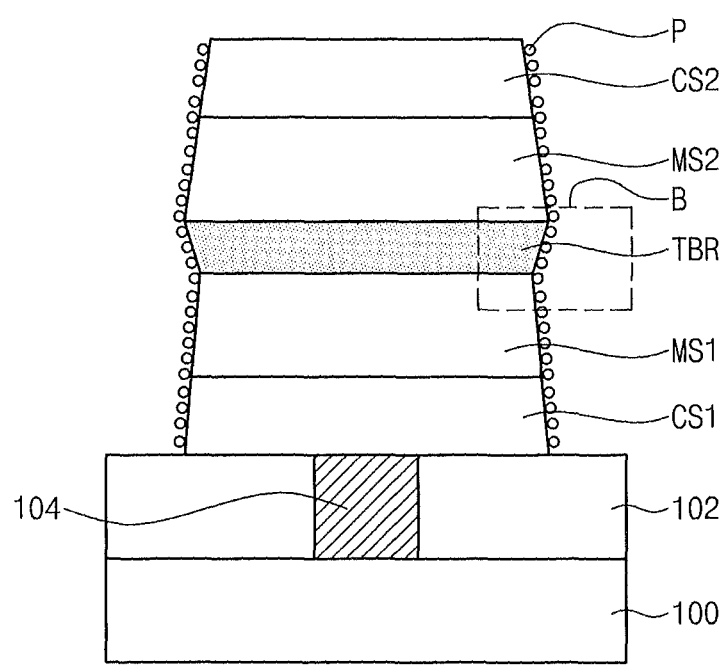
Figure 22:
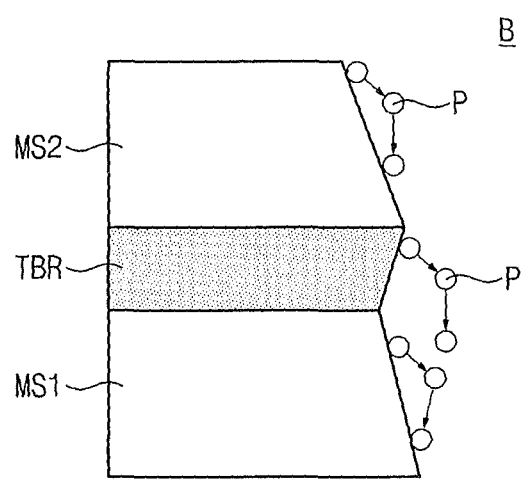
FIG. 22 is an enlarged view of a portion B of FIG. 21.

FIGS. 17 through 21 are sectional views illustrating a method of fabricating a magnetic memory device according to example embodiments of the inventive concept, and FIG. 22 is an enlarged view of a portion B of FIG. 21. In the following description of FIGS. 17 through 22, an element described with reference to FIGS. 6 through 8 may be identified by a similar or identical reference number without repeating an overlapping description thereof, for the sake of brevity.

Figure 17:
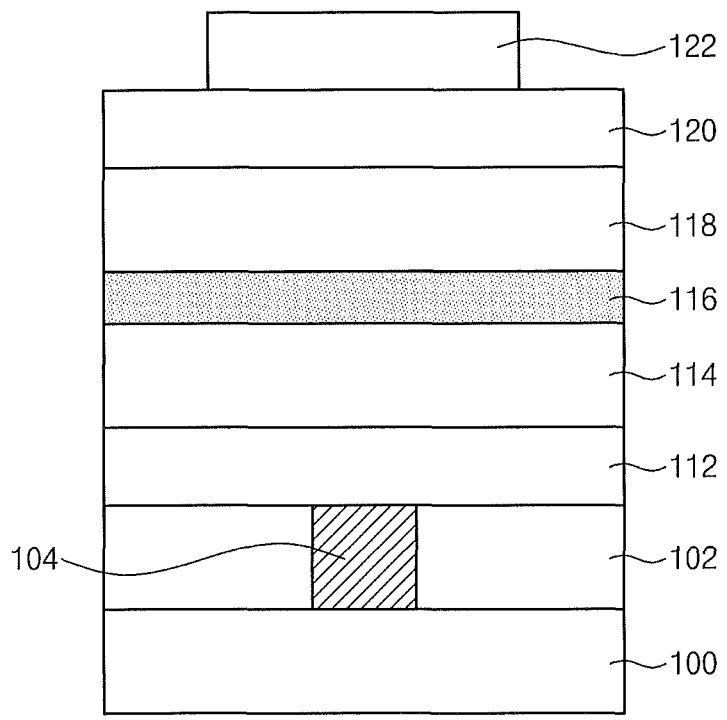
FIGS. 17 through 21 are sectional views illustrating a method of fabricating a magnetic memory device according to example embodiments of the inventive concepts.

Referring to FIG. 17, a first dielectric layer 102 may be formed on a substrate 100, and a lower contact plug 104 may be formed to penetrate the first dielectric layer 102. The lower contact plug 104 may be electrically connected to a terminal of the selection device. A first conductive layer 112 may be formed on the first dielectric layer 102. The first conductive layer 112 may include conductive metal nitrides (e.g., titanium nitride and/or tantalum nitride) and may include a material (e.g., ruthenium (Ru)) allowing magnetic layers constituting the magnetic tunnel junction MTJ to have a crystalline structure. The first conductive layer 112 may be formed using a sputtering process, a chemical vapor deposition process, or an atomic layer deposition process.

A first magnetic layer 114 may be formed on the first conductive layer 112. In example embodiments, the first magnetic layer 114 may include a plurality of sub-magnetic layers having fixed magnetization directions, and at least one non-magnetic layer interposed between the sub-magnetic layers. The sub-magnetic layers may include at least one of magnetic materials exhibiting the intrinsic perpendicular magnetization property (e.g., cobalt-platinum alloy) and/or magnetic materials exhibiting the intrinsic in-plane magnetization property (e.g., CoFeB), and the non-magnetic layer may include at least one non-magnetic material (e.g., Ru). The first magnetic layer 114 may be formed using a sputtering process, a chemical vapor deposition process, or an atomic layer deposition process.

A tunnel barrier layer 116 may be formed on the first magnetic layer 114. The tunnel barrier layer 116 may be formed of at least one dielectric material (e.g., magnesium oxide and/or aluminum oxide). The tunnel barrier layer 116 may be formed using a sputtering process, a chemical vapor deposition process, or an atomic layer deposition process.

A second magnetic layer 118 may be formed on the tunnel barrier layer 116. In example embodiments, the second magnetic layer 118 may include a plurality of sub-magnetic layers, whose magnetization directions can be switched, and at least one non-magnetic layer interposed between the sub-magnetic layers. The sub-magnetic layers may include at least one of magnetic materials exhibiting the intrinsic perpendicular magnetization property (e.g., cobalt-platinum alloy) and/or magnetic materials exhibiting the intrinsic in-plane magnetization property (e.g., CoFeB), and the non-magnetic layer may include at least one non-magnetic material (e.g., Ru). The second magnetic layer 118 may be formed using a sputtering process, a chemical vapor deposition process, or an atomic layer deposition process.

A second conductive layer 120 may be formed on the second magnetic layer 118. The second conductive layer 120 may include at least one of tantalum (Ta), aluminum (Al), copper (Cu), gold (Au), silver (Ag), titanium (Ti), or conductive metal nitrides (such as titanium nitride and/or tantalum nitride). The second conductive layer 120 may be formed using a sputtering process, a chemical vapor deposition process, or an atomic layer deposition process.

A mask pattern 122 may be formed on the second conductive layer 120. The mask pattern 122 may define regions of the substrate 100, on which the magnetic tunnel junctions MTJ are formed. The mask pattern 122 may be a photoresist pattern or a hard mask pattern containing at least one of oxide, nitride, and/or oxynitride.

Figure 18:
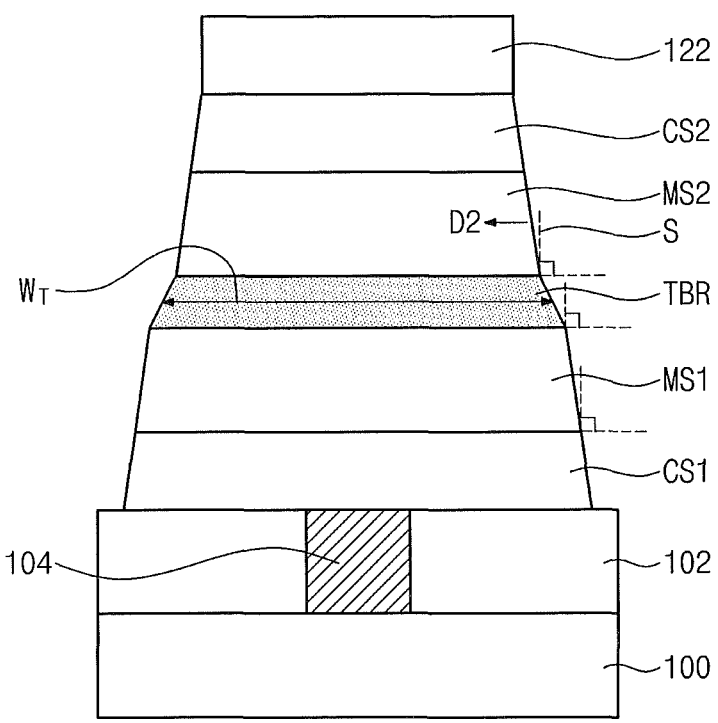

Referring to FIG. 18, the second conductive layer 120, the second magnetic layer 118, the tunnel barrier layer 116, the first magnetic layer 114, and the first conductive layer 112 may be successively patterned using the mask pattern 122 as an etch mask. Consequently, a first conductive structure CS1, a first magnetic structure MS1, a tunnel barrier TBR, a second magnetic structure MS2, and a second conductive structure CS2 may be sequentially formed on the substrate 100. In example embodiments, a first etching process may be performed for the patterning of the second conductive layer 120, the second magnetic layer 118, the tunnel barrier layer 116, the first magnetic layer 114, and the first conductive layer 112. The first etching process may be performed in such a way that the first and second magnetic layers 114 and 118 have an etch rate higher than that of the tunnel barrier layer 116. In other words, in the first etching process, the tunnel barrier layer 116 may have an etch selectivity with respect to the first and second magnetic layers 114 and 118, and the term 'etch selectivity' is used with this meaning in the present specification. The first etching process may be performed using a reactive-ion etching (RIE) process (e.g., a dry etching process).

After the first etching process, each of the first conductive structure CS1, the first magnetic structure MS1, the tunnel barrier TBR, the second magnetic structure MS2, and the second conductive structure CS2 may have a sidewall that is slanted with increasing height above the substrate 100 toward the second direction D2 relative to the reference plane S. In other words, each of the first conductive structure CS1, the first magnetic structure MS1, the tunnel barrier TBR, the second magnetic structure MS2, and the second conductive structure CS2 may have a positive sidewall profile.

It will be appreciated that the various structures of the magnetic memory devices according to embodiments of the present inventive concepts such as, for example, the first conductive structures CS1, the first magnetic structures MS1, the tunnel barriers TBR, the second magnetic structures MS2, and the second conductive structures CS2, include multiple sidewalls. Thus, for example, in the embodiment of FIG. 18, each of the above-mentioned structures includes at least a right sidewall and a left sidewall as shown in the cross-sectional drawing. It will be appreciated that the foregoing description (and the descriptions of other embodiments above) are referring to the same sidewall for each of the structures. Thus, for example, in the above-description of FIG. 18, the sidewalls that are discussed are the right sidewalls in FIG. 18. Typically, the opposite sidewalls (i.e., the left sidewalls in FIG. 18) will be slanted oppositely from the right sidewalls. In other words, in the embodiment of FIG. 18, the left sidewalls of each of the first conductive structure CS1, the first magnetic structure MS1, the tunnel barrier TBR, the second magnetic structure MS2, and the second conductive structure CS2 may have a negative sidewall profile.

In example embodiments, the sidewall of the first conductive structure CS1 may be aligned to that of the first magnetic structure MS1, and the sidewall of the second conductive structure CS2 may be aligned to that of the second magnetic structure MS2. In the first etching process, the tunnel barrier layer 116 may be etched with a lower etch rate than the other layers. Accordingly, an angle between the bottom surface and the sidewall of the tunnel barrier TBR may be smaller than the corresponding angles between the bottom surfaces and the sidewalls of the first conductive structure CS1, the first magnetic structure MS1, the second magnetic structure MS2, and the second conductive structure CS2, when viewed in a cross-sectional view. In other words, compared with the first conductive structure CS1, the first magnetic structure MS1, the second magnetic structure MS2, and the second conductive structure CS2, the sidewall of the tunnel barrier TBR may be further slanted toward the second direction D2 relative to the reference plane S. The horizontal width $W_T$ of the tunnel barrier TBR may decrease as a function of distance away from the substrate 100.

Referring to FIGS. 19 and 20, the first conductive structure CS1, the first magnetic structure MS1, and the tunnel barrier TBR may be over-etched during the first etching process. For example, the use of the reactive-ion etching process may result in the over-etching of the sidewalls of the first conductive structure CS1, the first magnetic structure MS1, and the tunnel barrier TBR. In addition, owing to the etch selectivity of the tunnel barrier TBR with respect to other layers in the first etching process, the first conductive structure CS1 and the first magnetic structure MS1 may be etched at a higher etch rate, compared to the tunnel barrier TBR. Especially, in the case where the process time of the first etching process is sufficiently long, the tunnel barrier TBR may have a sidewall slanted toward the first direction D1 that is opposite to the second direction D2, relative to the reference plane S, as shown in FIG. 20. In other words, the tunnel barrier TBR may have the negative sidewall profile, after the first etching process.

Referring to FIG. 21, the mask pattern 122 may be removed after the first etching process. The mask pattern 122 may be removed using an ashing and strip process. In certain embodiments, an etch residue P may be produced from reaction between etching gas for the first etching process and the layers (e.g., the second conductive layer 120, the second magnetic layer 118, the tunnel barrier layer 116, the first magnetic layer 114, and the first conductive layer 112) and be deposited on the sidewalls of the first conductive structure CS1, the first magnetic structure MS1, the tunnel barrier TBR, the second magnetic structure MS2, and the second conductive structure CS2. The etch residue P deposited on the sidewall of the tunnel barrier TBR may lead to electric short between the first and second magnetic structures MS1 and MS2. To remove the etch residue P, a second etching process may be performed on the structure with the etch residue P. In example embodiments, the second etching process may be performed using an ion-beam etching (IBE) process.

FIG. 22 is an enlarged view of a portion B of FIG. 21 and is provided to describe in more detail the second etching process for removing the etch residue P.

In example embodiments, as shown in FIG. 22, each of the first and second magnetic structures MS1 and MS2 may have the positive sidewall profile. During the second etching process, the etch residue P may be removed from and be re-deposited on the sidewalls of the first and second magnetic structures MS1 and MS2. For example, due to the positive sidewall profile of the first and second magnetic structures MS1 and MS2, the etch residue P detached from an upper sidewall of each magnetic structure may be moved downward and be re-deposited on a lower sidewall thereof or a sidewall of an underlying structure.

By contrast, the tunnel barrier TBR may have the negative sidewall profile, as the result of the over-etching in the first etching process. The negative sidewall profile of the tunnel barrier TBR makes it possible to reduce or prevent the etch residue P from being re-deposited on the sidewall of the tunnel barrier TBR during the second etching process. In other words, in the case where the tunnel barrier TBR is formed to have the negative sidewall profile, the etch residue P may not re-deposit on the tunnel barrier TBR and may be more effectively removed from the tunnel barrier TBR in the second etching process. Accordingly, it is possible to reduce or prevent the etch residue P from causing electric short between the first and second magnetic structures MS1 and MS2.

Referring back to FIG. 6, a second dielectric layer 108 may be formed on the substrate 100, and an upper contact plug 106 may be formed to penetrate the second dielectric layer 108 and be electrically connected to the second conductive structure CS2. Thereafter, an interconnection line 110 may be formed on the second dielectric layer 108 and may be connected to the upper contact plug 106.

According to example embodiments of the inventive concept, the tunnel barrier TBR of the magnetic tunnel junction MTJ may be provided to have a negative sidewall profile. For instance, the horizontal width $W_T$ of the tunnel barrier TBR may increase as a function of distance away from the substrate 100. Accordingly, in the second etching process, it is possible to more effectively remove the etch residue P, which may be produced in the first etching process for forming the magnetic tunnel junction MTJ, from the sidewall of the tunnel barrier TBR. Accordingly, the possibility of electric shorts between the first and second magnetic structures MS1, MS2 spaced apart from each other by the tunnel barrier TBR may be reduced, and thus, the magnetic memory device can have high reliability.

Referring again to FIGS. 6 and 7, it can be seen that the right sidewall (in the cross-sectional views of FIGS. 6 and 7) of the tunnel barrier TBR defines a first plane P1 that is shown by the dotted line P1P1 in FIG. 7 (the plane P1 extends into the page). This first plane P1 bisects the first magnetic structure MS1 into two pieces (which generally will not be the same size). Similarly, the right sidewall of the second magnetic structure MS2 defines a second plane P2 that is shown by the dotted line P2-P2 in FIG. 7. This second plane P2 does not bisect the first magnetic structure MS1. Additionally, the right sidewall of the first magnetic structure MS1 defines a third plane P3 that is shown by the dotted line P3-P3 in FIG. 7 that bisects both the tunnel barrier TBR and the second magnetic structure MS2.

It will also be appreciated that the sidewall of, for example, the tunnel barrier TBR need not slant along its entire length. For example, in another embodiment, a top section of the right sidewall of the tunnel barrier TBR that contacts a sidewall of the second magnetic structure MS2 may have a negative sidewall profile and a lower section of the right sidewall of the tunnel barrier TBR may be vertical or may have a positive sidewall profile in further embodiments. The sections may be designed in a way that it is unlikely that the etch residue P may deposit on the sidewall of the tunnel barrier TBR.

Figure 23:
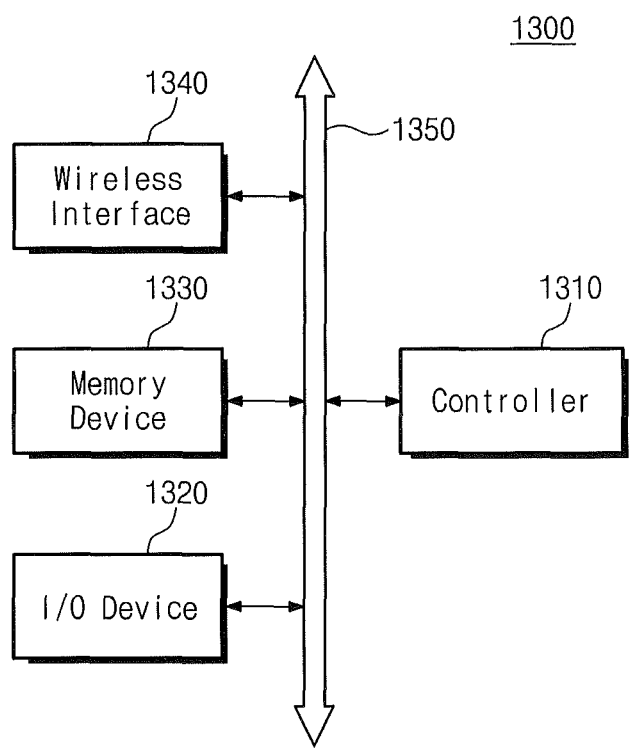
FIGS. 23 and 24 are block diagrams schematically illustrating electronic devices that include a semiconductor device according to example embodiments of the inventive concepts.
Figure 24:
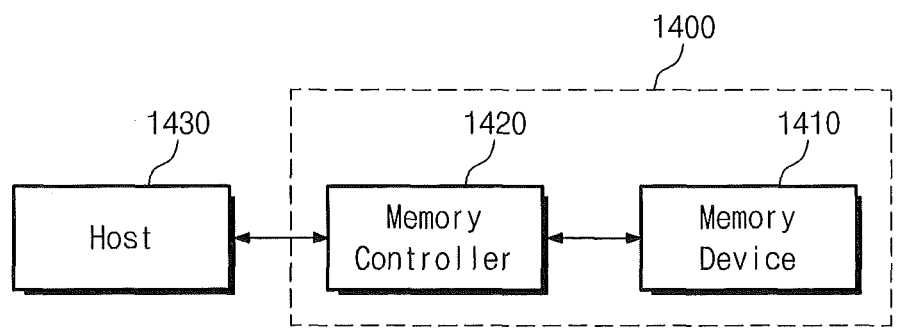

FIGS. 23 and 24 are block diagrams schematically illustrating electronic devices that include a semiconductor device according to example embodiments of the inventive concept.

Referring to FIG. 23, an electronic device 1300 including a semiconductor device according to example embodiments of the inventive concept may be used in one of a personal digital assistant (PDA), a laptop computer, a mobile computer, a web tablet, a wireless phone, a cell phone, a digital music player, a wired or wireless electronic device, or a complex electronic device including a combination of such functionalities. The electronic device 1300 may include a controller 1310, an input/output device(s) 1320 (such as a keypad, a keyboard, a display, etc.), a memory 1330, and/or a wireless interface 1340 that are connected/coupled to each other through a bus 1350. The controller 1310 may include, for example, at least one microprocessor, a digital signal process, a microcontroller, etc. The memory 1330 may be configured to store a command code to be used by the controller 1310 and/or user data. The memory 1330 may include a semiconductor device according to example embodiments of inventive concepts. The electronic device 1300 may use a wireless interface 1340 configured to transmit data to and/or receive data from a wireless communication network using a RF (radio frequency) signal. The wireless interface 1340 may include, for example, an antenna, a wireless transceiver, etc. The electronic device 1300 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 24, a memory system including a semiconductor device according to example embodiments of inventive concepts will be described. The memory system 1400 may include a memory device 1410 for storing relatively large quantities of data and a memory controller 1420. The memory controller 1420 controls the memory device 1410 so as to read data stored in the memory device 1410 and/or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

According to example embodiments of the inventive concepts, the tunnel barrier of the magnetic tunnel junction may have a negative sidewall profile, and thus, it is possible to more effectively remove an etch residue from the sidewall of the tunnel barrier. Accordingly, electric short can be reduced or prevented between magnetic layers that are spaced apart from each other by the tunnel barrier, and this may make it possible to realize a magnetic memory device with improved reliability.

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
a substrate; and
a magnetic tunnel junction on a top surface of the substrate, the magnetic tunnel junction including a first magnetic structure and a second magnetic structure that are spaced apart from each other with a tunnel barrier interposed therebetween,
wherein the first magnetic structure is disposed between the substrate and the tunnel barrier, and
when viewed in a cross-sectional view, a width of a top surface of the tunnel barrier is larger than a width of a bottom surface of the tunnel barrier and a width of a top surface of the second magnetic structure is smaller than a width of a bottom surface of the second magnetic structure.

2. The magnetic memory device of claim 1, wherein a width of the tunnel barrier increases monotonically from the bottom surface thereof to the top surface thereof.

3. The magnetic memory device of claim 1, wherein a width of the tunnel barrier increases with increasing distance from the substrate.

4. The magnetic memory device of claim 1, wherein a width of the tunnel barrier increases with increasing distance from the substrate, and
a width of the second magnetic structure decreases with increasing distance from the substrate.

5. The magnetic memory device of claim 4, wherein the top surface of the tunnel barrier is in contact with the bottom surface of the second magnetic structure.

6. The magnetic memory device of claim 1, wherein, when viewed in a cross-sectional view, a width of a top surface of the first magnetic structure is smaller than a width of a bottom surface of the first magnetic structure.

7. The magnetic memory device of claim 6, wherein a width of the first magnetic structure decreases with increasing distance from the substrate, and
a width of the tunnel barrier increases with increasing distance from the substrate.

8. The magnetic memory device of claim 1, wherein the second magnetic structure comprises at least one magnetic layer, whose magnetization direction is switchable.

9. The magnetic memory device of claim 1, wherein the second magnetic structure comprises at least one magnetic layer, whose magnetization direction is fixed.

10. A magnetic memory device, comprising:
a tunnel barrier on a substrate;
a first magnetic structure between the substrate and the tunnel barrier; and
a second magnetic structure spaced apart from the first magnetic structure with the tunnel barrier interposed therebetween,
wherein, when viewed in a cross-sectional view, the tunnel barrier has a sidewall that is slanted with increasing height above the substrate toward a first direction relative to a reference plane that is perpendicular to a top surface of the substrate and the second magnetic structure has a sidewall that is slanted with increasing height above the substrate toward a second direction relative to the reference plane, where the first and second directions are opposite to each other,
wherein the sidewalls of the tunnel barrier and the second magnetic structure are on a first side of the magnetic memory device.

11. The device of claim 10, wherein an angle between the sidewall and a bottom surface of the tunnel barrier is larger than 90 degrees.

12. The device of claim 10, wherein an angle between the sidewall and a bottom surface of the second magnetic structure is smaller than 90 degrees.

13. The device of claim 10, wherein a top surface of the tunnel barrier is in contact with a bottom surface of the second magnetic structure.

14. The device of claim 10, wherein the first magnetic structure has a sidewall that is slanted with increasing height above the substrate toward the second direction relative to the reference plane, wherein the sidewall of the first magnetic structure is on the first side of the magnetic memory device.

15. A magnetic memory device, comprising:
a substrate having a top surface and a bottom surface;
a first magnetic structure on the top surface of the substrate;
a tunnel barrier on a top surface of the first magnetic structure; and
a second magnetic structure on a top surface of the tunnel barrier,
wherein a first sidewall of the second magnetic structure contacts a first sidewall of the tunnel barrier, and
wherein a section of the first sidewall of the tunnel barrier is slanted in a first direction with respect to a first plane that is perpendicular to the top surface of the substrate and a section of the first sidewall of the second magnetic structure that contacts the section of the first sidewall of the tunnel barrier is slanted in a second direction with respect to the first plane that is opposite the first direction.

16. The magnetic memory device of claim 15, wherein the first sidewall of the tunnel barrier defines a second plane that bisects the first magnetic structure.

17. The magnetic memory device of claim 16, wherein the first sidewall of the second magnetic structure defines a third plane that does not bisect the first magnetic structure.

18. The magnetic memory device of claim 17, wherein a width of the top surface of the tunnel barrier is greater than a width of the bottom surface of the tunnel barrier.

19. The magnetic memory device of claim 17, wherein a first sidewall of the first magnetic structure that contacts the first sidewall of the tunnel barrier defines a fourth plane that bisects both the tunnel barrier and the second magnetic structure.

* * * * *